(12) United States Patent
Corsi et al.

(10) Patent No.: US 8,576,007 B2
(45) Date of Patent: Nov. 5, 2013

(54) HIGH SPEED AMPLIFIER

(75) Inventors: Marco Corsi, Parker, TX (US); Victoria W. Limketkai, Dallas, TX (US); Venkatesh Srinivasan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 69 days.

(21) Appl. No.: 13/229,445

(22) Filed: Sep. 9, 2011

(65) Prior Publication Data

US 2013/0063210 A1    Mar. 14, 2013

(51) Int. Cl.
*H03F 3/45* (2006.01)
(52) U.S. Cl.
USPC .......................................... 330/260; 330/261
(58) Field of Classification Search
USPC .......................................... 330/260, 261, 253
See application file for complete search history.

(56) References Cited

U.S. PATENT DOCUMENTS

| | | | | |
|---|---|---|---|---|
| 6,642,787 B1 * | 11/2003 | Souetinov et al. | ............ | 330/252 |
| 6,717,467 B2 * | 4/2004 | Renous et al. | ............... | 330/253 |
| 6,822,817 B2 * | 11/2004 | Chung et al. | .................... | 360/46 |
| 7,679,436 B2 * | 3/2010 | Jimenez et al. | ................. | 330/51 |
| 7,705,677 B2 * | 4/2010 | Forbes et al. | ................. | 330/253 |
| 2002/0024382 A1 | 2/2002 | Kwan et al. | | |

* cited by examiner

*Primary Examiner* — Henry Choe
(74) *Attorney, Agent, or Firm* — Alan A. R. Cooper; W. James Brady, III; Frederick J. Telecky, Jr.

(57) ABSTRACT

For high speed amplifiers, the parasitic capacitances from the differential input pair introduce a zero that can affect performance. Here, a neutralization network has been provided that compensates for this zero by shifting its position. This is generally accomplished by using a pair of capacitors that are cross-coupled across the differential input pair of the amplifier.

10 Claims, 3 Drawing Sheets

HIGH SPEED AMPLIFIER

TECHNICAL FIELD

The invention relates generally to high speed amplifiers and, more particularly, to a high speed telescopic amplifier.

BACKGROUND

Turning to FIG. 1, a conventional telescopic amplifier 100 can be seen. As shown, this telescopic amplifier 100 generally comprises a differential input pair (which generally comprises transistors Q2 and Q7) and several bias networks (which generally comprise cascoded transistor pairs Q1/Q6, Q3/Q8, Q4/Q9, and Q5/Q10). These bias networks are typically configured as current minors (each being coupled to a diode-connected transistor) or may be configured so that biases BIAS1 to BIAS4 are bias voltages. Generally, for high speed applications (i.e., greater than 10 GHz), parasitics (such as parasitic capacitances) can become problematic. In particular, parasitic capacitances resulting from configuration of transistors Q1 to Q4 and Q6 to Q9 can cause signal degradation.

Looking first to the internal nodes between transistors Q1 to Q3 and Q6 to Q8, bias network Q3/Q8 and differential pair Q2/Q7 introduce a parasitic pole (which is typically at a ratio of transconductance to parasitic capacitance CP). The parasitic capacitance CP is generally a linear combination of the gate-drain, source/drain-body, and gate-source capacitances of transistors Q2, Q3, Q7 and Q8 (represented by parasitic capacitors CP1 to CP6 for the sake of simplicity). Typically, with a current of 1 mA in each branch, a transconductance of 10 mS, and a total parasitic capacitance of 450 fF, there is a pole at 3.5 GHz, and, with a current of 600 µA in each branch, a transconductance of 6 mS, and, because there is a total parasitic capacitance of 450 fF, there is a pole at 2.1 GHz. This parasitic capacitance is usually large due to a low input referred noise limitation imposed on the amplifier 100. Thus, there is a need to compensate for the pole introduced by the parasitic capacitance of bias network Q3/Q8 and differential pair Q2/Q7.

Turning to the input terminals INP and INM, each of the transistors Q2 and Q7 has a gate-drain parasitic capacitance (represented by parasitic capacitors CP1 and CP3). These gate-drain parasitic capacitances CP1 and CP3 result in a right-half plane zero, which can be at (for example) about 20 GHz (i.e., $g_{mdiff}/CP$). Thus, there is a need to compensate for the zero introduced by the parasitic capacitance of the differential input pair Q2/Q7.

An example of a conventional circuit is U.S. Patent Pre-Grant Publ. Non. 2002/0024382.

SUMMARY

An embodiment of the present invention, accordingly, provides an apparatus. The apparatus comprises an amplifier that receives an input signal and that generates an output signal, wherein the amplifier includes: a first transistor having a first passive electrode, a second passive electrode, and a control electrode, wherein the control electrode of the first transistor receives a first portion of the input signal; and a second transistor having a first passive electrode, a second passive electrode, and a control electrode, wherein the control electrode of the second transistor receives a second portion of the input signal; and a neutralization network having: a first neutralization capacitor that is coupled between the control electrode of the first transistor and the second passive electrode of the second transistor; and a second neutralization capacitor that is coupled between the control electrode of the second transistor and the second passive electrode of the first transistor.

In accordance with an embodiment of the present invention, the amplifier further comprises: a first output terminal that is adapted to provide a first portion of the output signal; a second output terminal that is adapted to provide a second portion of the output signal; a first bias network that is coupled to the first passive electrode of each of the first and second transistors; and a second bias network that is coupled to the second passive electrode of each of the first and second transistors.

In accordance with an embodiment of the present invention, the first and second transistors are MOS transistors, and wherein the first passive electrode, the second passive electrode, and the control electrode of each of the first and second transistors are the source, drain, and gate, respectively.

In accordance with an embodiment of the present invention, the first and second transistors further comprise first and second PMOS transistors, respectively.

In accordance with an embodiment of the present invention, the first bias network further comprises: a third PMOS transistor that is coupled to the source of the first PMOS transistor at its drain; and a fourth PMOS transistor that is coupled to the source of the second PMOS transistor at is drain and that is coupled to the gate of the third PMOS transistor at its gate.

In accordance with an embodiment of the present invention, the second bias network further comprises: a fifth PMOS transistor that is coupled to the drain of the first PMOS transistor at its source; and a sixth PMOS transistor that is coupled to the drain of the second PMOS transistor at is source and that is coupled to the gate of the fifth PMOS transistor at its gate.

In accordance with an embodiment of the present invention, the first and second transistors are bipolar transistors, and wherein the first passive electrode, the second passive electrode, and the control electrode of each of the first and second transistors are the collector, emitter, and base, respectively.

In accordance with an embodiment of the present invention, the first and second transistors further comprise first and second PNP transistors, respectively.

In accordance with an embodiment of the present invention, an apparatus comprising: an amplifier that receives an input signal and that generates an output signal, wherein the amplifier includes: a first transistor having a first passive electrode, a second passive electrode, and a control electrode, wherein the control electrode of the first transistor receives a first portion of the input signal; a second transistor having a first passive electrode, a second passive electrode, and a control electrode, wherein the control electrode of the second transistor receives a second portion of the input signal; and a plurality of bias networks that are coupled to at least one of the first passive electrode and the second passive electrode of each of the first and second transistors; and a neutralization network having: a first neutralization capacitor that is coupled between the control electrode of the first transistor and the second passive electrode of the second transistor; and a second neutralization capacitor that is coupled between the control electrode of the second transistor and the second passive electrode of the first transistor.

In accordance with an embodiment of the present invention, the plurality of bias networks further comprises a first bias network, and wherein the first bias network further comprises: a third PMOS transistor that is coupled to the source of the first PMOS transistor at its drain; and a fourth PMOS transistor that is coupled to the source of the second PMOS transistor at is drain and that is coupled to the gate of the third PMOS transistor at its gate.

In accordance with an embodiment of the present invention, the plurality of bias networks further comprises a second bias network, and wherein the second bias network further comprises: a fifth PMOS transistor that is coupled to the drain of the first PMOS transistor at its source; and a sixth PMOS transistor that is coupled to the drain of the second PMOS transistor at is source and that is coupled to the gate of the fifth PMOS transistor at its gate.

In accordance with an embodiment of the present invention, an apparatus is provided. The apparatus comprises a first output terminal; a second output terminal; a first PMOS transistor; a second PMOS transistor that is coupled to the first PMOS transistor at its gate, wherein the first and second PMOS transistors receive a first bias at their gates; a third PMOS transistor that is coupled to the drain of the first PMOS transistor at its source and that receives a first portion of a differential input signal at its gate; a fourth PMOS transistor that is coupled to the drain of the second PMOS transistor at its source and that receives a second portion of the differential input signal at its gate; a fifth PMOS transistor that is coupled to the drain of the third PMOS transistor at its source and the first output terminal at its drain; a sixth PMOS transistor that is coupled to the drain of the fourth PMOS transistor at its source, the second output terminal at its drain, and the gate of the fifth PMOS transistor at its gate, wherein the fifth and sixth PMOS transistors receive a second bias at their gates; a first NMOS transistor that is coupled to the drain of the fifth PMOS transistor at its drain; a second NMOS transistor that is coupled to the drain of the sixth PMOS transistor at its drain and the gate of the first NMOS transistor at its gate, wherein the first and second NMOS transistors receive a third bias at their gates; a first neutralization capacitor that is coupled between the gate of the third PMOS transistor and the drain of the fourth PMOS transistor; and a second neutralization capacitor that is coupled between the gate of the fourth PMOS transistor and the drain of the third PMOS transistor.

In accordance with an embodiment of the present invention, the first and second neutralization capacitors further comprise first and second MOS capacitors, respectively.

In accordance with an embodiment of the present invention, the capacitance of each of the first and second MOS capacitors is about 40 fF.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
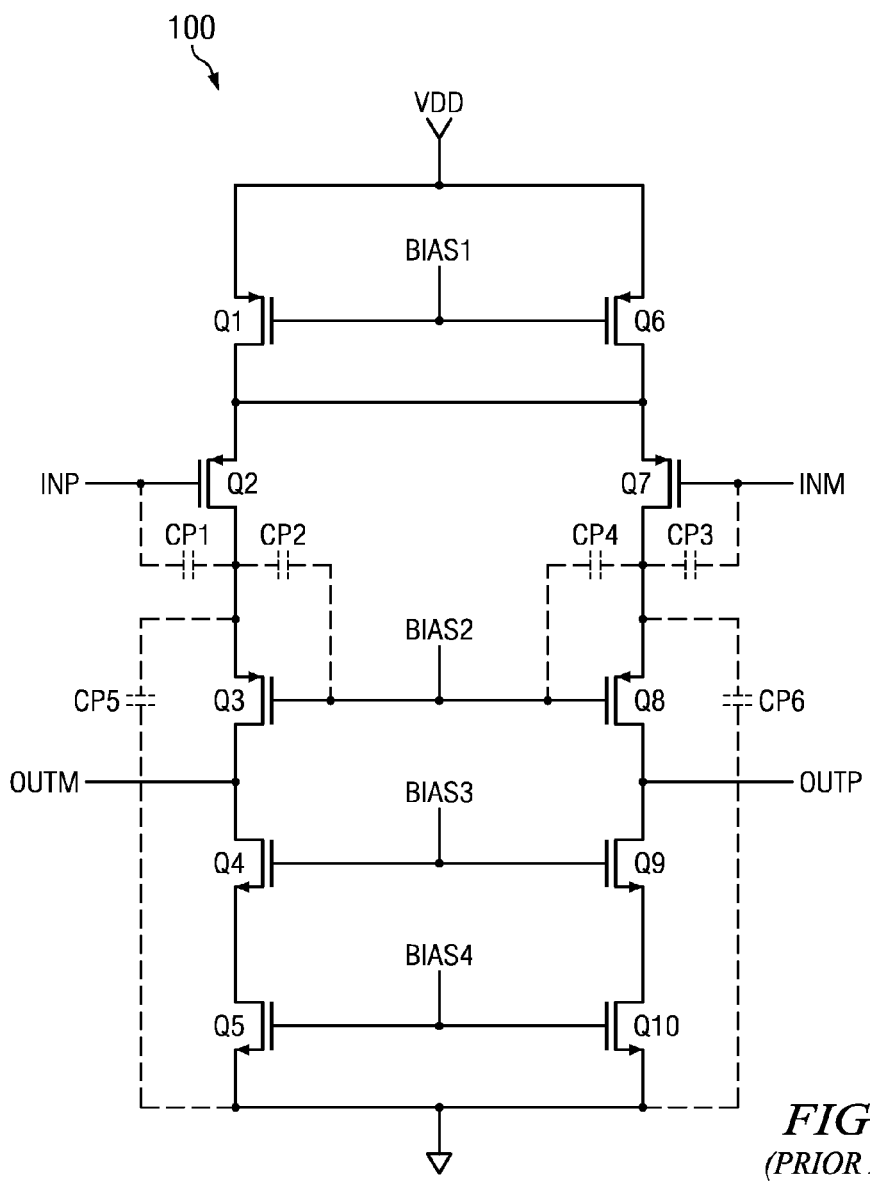
FIG. 1 is an example of a conventional telescopic amplifier.

Refer now to the drawings wherein depicted elements are, for the sake of clarity, not necessarily shown to scale and wherein like or similar elements are designated by the same reference numeral through the several views.

Figure 2A:
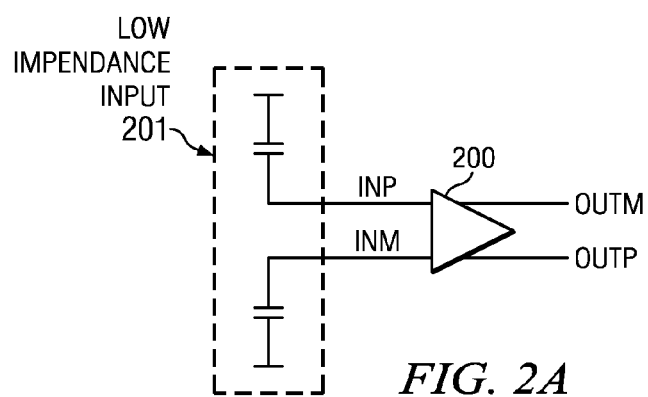
FIGS. 2A and 2B are an example of a telescopic amplifier in accordance with a preferred embodiment of the present invention.
Figure 2B:
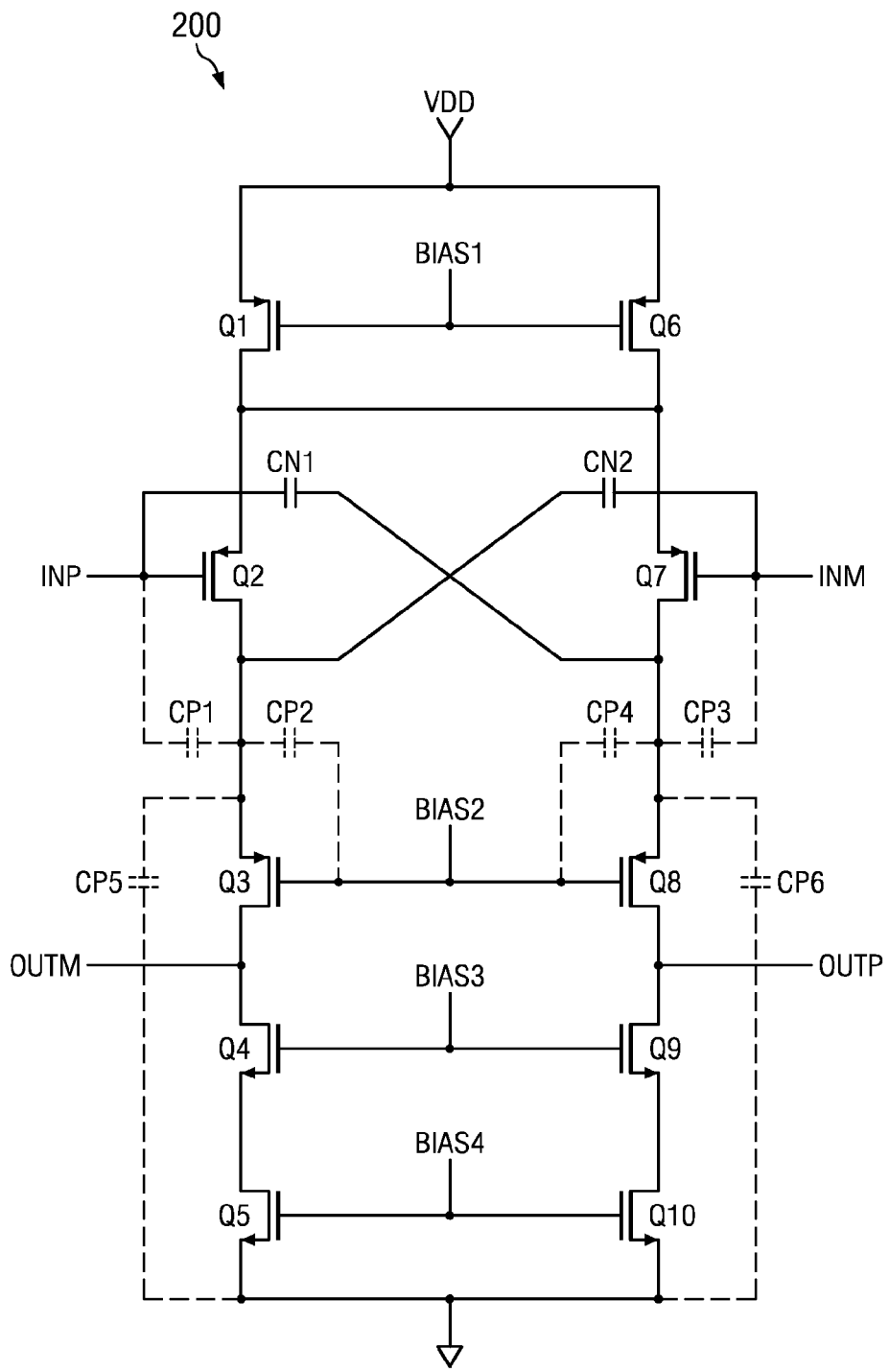

Turning to FIGS. 2A and 2B, a telescopic amplifier 200 in accordance with an embodiment of the present invention can be seen. Amplifier 200 is generally employed to receive input signals from a low impedance input 201, such as a capacitive input, so as to allow amplifier 200 to, for example, be employed as a transconductance amplifier for a sigma-delta modulator. Telescopic amplifier 200 has the same general configuration as telescopic amplifier 100, except that telescopic amplifier 200 includes s neutralization network (capacitors CN1 and CN2). As shown, telescopic amplifier 200 can be implemented with MOS transistors (i.e., transistors Q1 to Q3 and Q6 to Q8 are PMOS transistors and transistors Q4, Q5, Q9, and Q10 are NMOS transistors), but telescopic amplifier 200 can also be implemented with bipolar transistors (i.e., transistors Q1 to Q3 and Q6 to Q8 are PNP transistors and transistors Q4, Q5, Q9, and Q10 are NPN transistors). The neutralization network (capacitors CN1 and CN2) is generally employed to improve performance by compensating for poles and zeros, while also reducing power consumption. Alternatively, transistors Q1 to Q10 can be replaced with transistors of the opposite conductivity type than shown in FIG. 2 (i.e., transistor Q4 can be a PMOS or PNP transistor instead of an NMOS or NPN transistor while transistor Q1 can be an NMOS or NPN transistor instead of a PMOS or PNP transistor).

With respect to the neutralization network CN1/CN2, capacitors CN1 and CN2 can change the position of the zero introduced by parasitic capacitances CP1 and CP6. The transfer functions $H_M(s)$ and $H_P(s)$ for each half of the telescopic amplifier 100 without a neutralization network CN1/CN2 can be expressed as:

$$H_M(s) = \frac{A\left(1 - s\frac{CP1}{g_{mQ2}}\right)}{\left(1 + \frac{s}{WPD}\right)\left(1 + s\frac{CP1 + CP2 + CP5}{g_{mQ3}}\right)}, \text{ and} \quad (1)$$

$$H_P(s) = \frac{A\left(1 - s\frac{CP3}{g_{mQ7}}\right)}{\left(1 + \frac{s}{WPD}\right)\left(1 + s\frac{CP3 + CP4 + CP6}{g_{mQ8}}\right)}, \quad (2)$$

where WPD is the dominant pole due to the load at the output terminals OUTP and OUTM, $g_{mQ2}$, $g_{mQ3}$, $g_{mQ7}$, and $g_{mQ8}$ are the transconductances of the transistors Q2, Q3 Q7, and Q8, respectively. As can be seen from equations (1) and (2), the transfer functions $H_M(s)$ and $H_P(s)$ indicates a dominant pole WPD, parasitic poles at $$\frac{g_{mQ3}}{CP1 + CP2 + CP5} \text{ and } \frac{g_{mQ8}}{CP3 + CP4 + CP6},$$

and a right-half plane zeros at $$\frac{g_{mQ2}}{CP1} \text{ and } \frac{g_{mQ7}}{CP3}.$$

Typically, transistors Q2 and Q7 are matched, having approximately the same aspect ratio (channel width to channel length), and capacitors CN1 and CN2 (which are typically MOS capacitors) each have an aspect ratio that is one half of aspect ratio of transistors Q2 and Q7 and each have a capacitance of about 40 fF (as an example) at a nominal corner. Alternatively, capacitors CN1 and CN2 can be metal-insulator-metal (MIM) capacitors having a capacitance (for example) of about 40 fF, but MOS capacitors are preferred because MOS capacitors should track transistors Q2 and Q7 across process corners. The capacitors CN1 and CN2 are cross-coupled between the drains and gates of transistors Q2 and Q7. By introducing the neutralization network CN1/CN2, the transfer functions $H_M(s)$ and $H_P(s)$ (shown in equations (1) and (2)) can be modified as follows:

$$H_M(s) = \frac{A\left(1 - s\frac{CP1 - CN2}{g_{mQ2}}\right)}{\left(1 + \frac{s}{WPD}\right)\left(1 + s\frac{CP1 + CP2 + CP5}{g_{mQ3}}\right)}, \text{ and} \quad (3)$$

$$H_P(s) = \frac{A\left(1 - s\frac{CP3 - CN1}{g_{mQ7}}\right)}{\left(1 + \frac{s}{WPD}\right)\left(1 + s\frac{CP3 + CP4 + CP6}{g_{mQ8}}\right)}. \quad (4)$$

As shown in equations (3) and (4), the neutralization network CN1/CN2 "moves" the zero from $$\frac{CP1}{g_{mQ2}} \text{ and } \frac{CP1}{g_{mQ7}} \text{ to } \frac{CP1 - CN2}{g_{mQ2}} \text{ and } \frac{CP3 - CN1}{g_{mQ7}}$$

Figure 3:
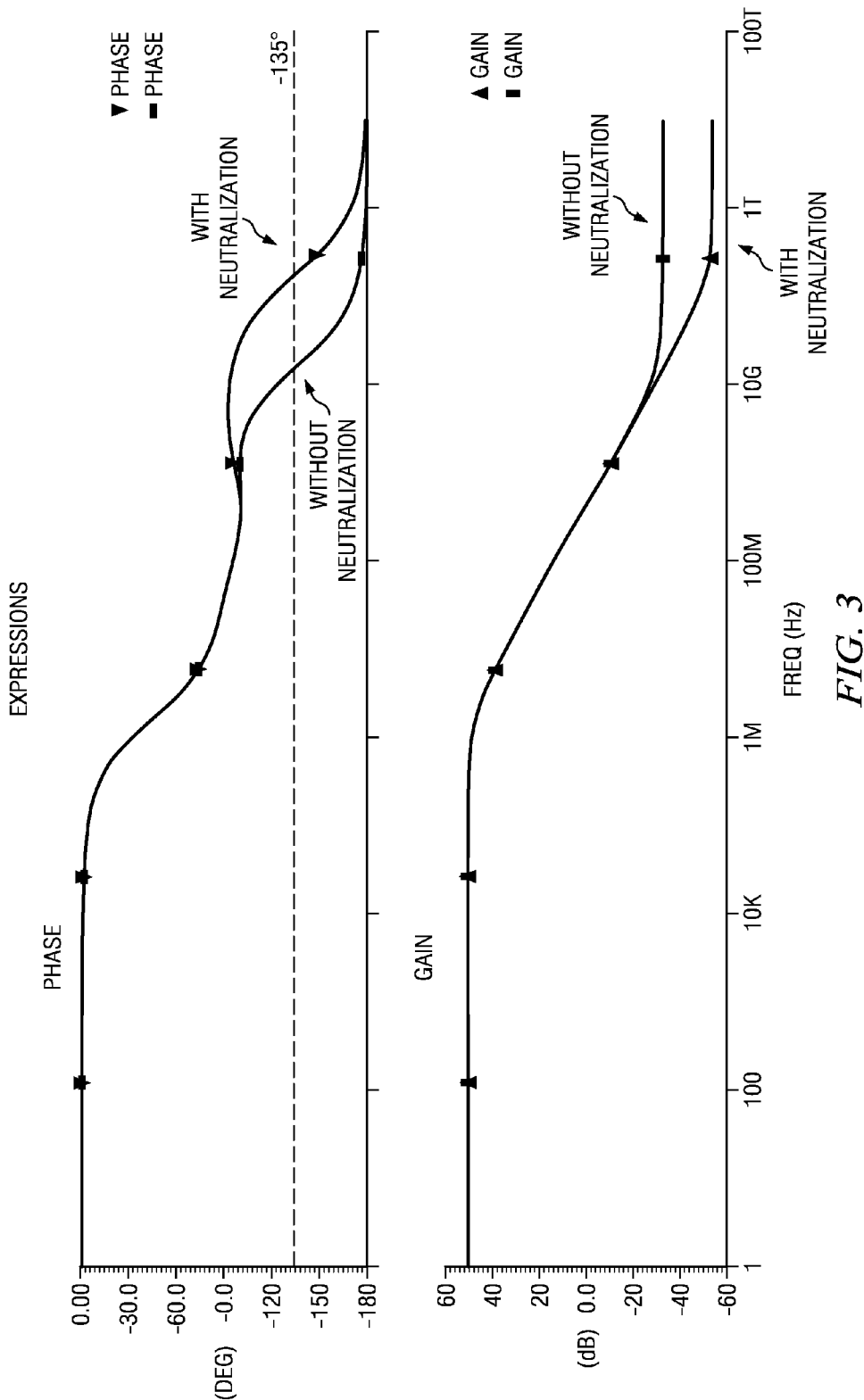
FIG. 3 is a diagram illustrating the use of the neutralization network in the telescopic amplifier of FIGS. 2A and 2B.

(which can, for example, result in a change from 20 Ghz to 30 GHz). Additionally, capacitors CN1 and CN2 (when MOS capacitors are employed) remain in subthreshold with a negligible current. In FIG. 3, the transient response, gain, and phase can be seen with and without the neutralization network CN1/CN2, and, as shown, at −45° the phase is shifted, indicating zero has been moved by the neutralization network CN1/CN2.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   an amplifier that receives an input signal and that generates an output signal, wherein the amplifier includes:
     a first transistor having a first passive electrode, a second passive electrode, and a control electrode, wherein the control electrode of the first transistor receives a first portion of the input signal; and
     a second transistor having a first passive electrode, a second passive electrode, and a control electrode, wherein the control electrode of the second transistor receives a second portion of the input signal; and
     a neutralization network having:
       a first neutralization capacitor that is coupled between the control electrode of the first transistor and the second passive electrode of the second transistor; and
       a second neutralization capacitor that is coupled between the control electrode of the second transistor and the second passive electrode of the first transistor,
     wherein the amplifier further comprises:
       a first output terminal that is adapted to provide a first portion of the output signal;
       a second output terminal that is adapted to provide a second portion of the output signal;
       a first bias network that is coupled to the first passive electrode of each of the first and second transistors; and
       a second bias network that is coupled to the second passive electrode of each of the first and second transistors,
     wherein the first and second transistors are MOS transistors, and wherein the first passive electrode, the second passive electrode, and the control electrode of each of the first and second transistors are the source, drain, and gate, respectively,
     wherein the first and second transistors further comprise first and second PMOS transistors, respectively,
     wherein the first bias network further comprises:
       a third PMOS transistor that is coupled to the source of the first PMOS transistor at its drain; and
       a fourth PMOS transistor that is coupled to the source of the second PMOS transistor at is drain and that is coupled to the gate of the third PMOS transistor at its gate.

2. The apparatus of 1, wherein the second bias network further comprises:
   a fifth PMOS transistor that is coupled to the drain of the first PMOS transistor at its source; and
   a sixth PMOS transistor that is coupled to the drain of the second PMOS transistor at is source and that is coupled to the gate of the fifth PMOS transistor at its gate.

3. The apparatus of claim 1, wherein the first and second transistors further comprise first and second PNP transistors, respectively.

4. An apparatus comprising:
   a amplifier that receives an input signal and that generates an output signal, wherein the amplifier includes:
     a first transistor having a first passive electrode, a second passive electrode, and a control electrode, wherein the control electrode of the first transistor receives a first portion of the input signal;
     a second transistor having a first passive electrode, a second passive electrode, and a control electrode, wherein the control electrode of the second transistor receives a second portion of the input signal; and
     a plurality of bias networks that are coupled to at least one of the first passive electrode and the second passive electrode of each of the first and second transistors; and
     a neutralization network having:
       a first neutralization capacitor that is coupled between the control electrode of the first transistor and the second passive electrode of the second transistor; and
       a second neutralization capacitor that is coupled between the control electrode of the second transistor and the second passive electrode of the first transistor, wherein the first and second transistors are MOS transistors, and wherein the first passive electrode, the second passive electrode, and the control electrode of each of the first and second transistors are the source, drain, and gate, respectively, wherein the first and second transistors further comprise first and second PMOS transistors, respectively, wherein the plurality of bias networks further comprises a first bias network, and wherein the first bias network further comprises:

a third PMOS transistor that is coupled to the source of the first PMOS transistor at its drain; and a fourth PMOS transistor that is coupled to the source of the second PMOS transistor at is drain and that is coupled to the gate of the third PMOS transistor at its gate.

5. The apparatus of claim 4, wherein the plurality of bias networks further comprises a second bias network, and wherein the second bias network further comprises:

a fifth PMOS transistor that is coupled to the drain of the first PMOS transistor at its source; and a sixth PMOS transistor that is coupled to the drain of the second PMOS transistor at is source and that is coupled to the gate of the fifth PMOS transistor at its gate.

6. The apparatus of claim 4, wherein the first and second transistors further comprise first and second PNP transistors, respectively.

7. An apparatus comprising:

a first output terminal;

a second output terminal;

a first PMOS transistor;

a second PMOS transistor that is coupled to the first PMOS transistor at its gate, wherein the first and second PMOS transistors receive a first bias at their gates;

a third PMOS transistor that is coupled to the drain of the first PMOS transistor at its source and that receives a first portion of a differential input signal at its gate;

a fourth PMOS transistor that is coupled to the drain of the second PMOS transistor at its source and that receives a second portion of the differential input signal at its gate;

a fifth PMOS transistor that is coupled to the drain of the third PMOS transistor at its source and the first output terminal at its drain;

a sixth PMOS transistor that is coupled to the drain of the fourth PMOS transistor at its source, the second output terminal at its drain, and the gate of the fifth PMOS transistor at its gate, wherein the fifth and sixth PMOS transistors receive a second bias at their gates;

a first NMOS transistor that is coupled to the drain of the fifth PMOS transistor at its drain;

a second NMOS transistor that is coupled to the drain of the sixth PMOS transistor at its drain and the gate of the first NMOS transistor at its gate, wherein the first and second NMOS transistors receive a third bias at their gates;

a first neutralization capacitor that is coupled between the gate of the third PMOS transistor and the drain of the fourth PMOS transistor; and a second neutralization capacitor that is coupled between the gate of the fourth PMOS transistor and the drain of the third PMOS transistor.

8. The apparatus of claim 7, wherein the first and second neutralization capacitors further comprise first and second MOS capacitors, respectively.

9. The apparatus of claim 8, wherein the apparatus has a parasitic zero at 20 GHz.

10. The apparatus of claim 9, wherein the capacitance of each of the first and second MOS capacitors is about 40 fF.

* * * * *